(12) United States Patent
Kim et al.

(10) Patent No.: US 7,282,741 B2
(45) Date of Patent: Oct. 16, 2007

(54) VERTICAL TYPE NITRIDE SEMICONDUCTOR LIGHT EMITTING DIODE

(75) Inventors: Dong Woo Kim, Suwon (KR); Yong Chun Kim, Suwon (KR); Hyun Kyung Kim, Suwon (KR)

(73) Assignee: Samsung Electro-Mechanics Co., Ltd. (KR)

( * ) Notice: Subject to any disclaimer, the term of this patent is extended or adjusted under 35 U.S.C. 154(b) by 173 days.

(21) Appl. No.: 11/153,500

(22) Filed: Jun. 16, 2005

(65) Prior Publication Data
US 2006/0202227 A1  Sep. 14, 2006

(30) Foreign Application Priority Data
Feb. 28, 2005 (KR) ............ 10-2005-0016525

(51) Int. Cl.
*H01L 27/15* (2006.01)
*H01L 29/06* (2006.01)

(52) U.S. Cl. .......... 257/79; 257/13; 257/E33.01; 257/E51.018; 257/E25.028

(58) Field of Classification Search .......... 257/13, 257/E31.099, E31.105, E33.001, E51.018, 257/E51.022, E51.026, 79, E25.028, E25.019, 257/103
See application file for complete search history.

(56) References Cited

U.S. PATENT DOCUMENTS 6,307,218 B1*  10/2001  Steigerwald et al. .......... 257/99
2005/0133807 A1*  6/2005  Park et al. .......... 257/99
2006/0192206 A1*  8/2006  Kong et al. .......... 257/79

FOREIGN PATENT DOCUMENTS

KR  10-2005-0008259 A  1/2005

* cited by examiner

*Primary Examiner*—Long K. Tran
(74) *Attorney, Agent, or Firm*—McDermott Will & Emery LLP

(57) ABSTRACT

Disclosed herein is a vertical type nitride semiconductor light emitting diode. The nitride semiconductor light emitting diode comprises an n-type nitride semiconductor layer, an active layer formed under the n-type nitride semiconductor layer, a p-type nitride semiconductor layer formed under the active layer, and an n-side electrode which comprises a bonding pad formed adjacent to an edge of an upper surface of the n-type nitride semiconductor layer and at least one extended electrode formed in a band from the bonding pad. The bonding pad of the n-side electrode is formed adjacent to the edge of the upper surface of the n-type nitride semiconductor layer acting as a light emitting surface, thereby preventing a wire from shielding light emitted from the active layer. The extended electrode can be formed in various shapes, and prevents concentration of current density, thereby ensuring effective distribution of the current density.

15 Claims, 4 Drawing Sheets

(a)

(b)

VERTICAL TYPE NITRIDE SEMICONDUCTOR LIGHT EMITTING DIODE

RELATED APPLICATIONS

The present invention is based on, and claims priority from, Korean Application Number 10-2005-0016525, filed Feb. 28, 2005, the disclosure of which is incorporated by reference herein in its entirety.

BACKGROUND OF THE INVENTION

1. Field of the Invention

The present invention relates to a vertical type nitride semiconductor light emitting diode, and, more particularly, to a vertical type nitride semiconductor light emitting diode, which has a bonding pad of an n-side electrode formed adjacent to an edge of an upper surface of an n-type nitride semiconductor layer serving as a light emitting surface for the nitride semiconductor light emitting diode, thereby preventing a wire bonding portion from shielding light emitted from the light emitting surface, and which has an extended electrode of the n-side electrode formed in various shapes from the bonding pad, thereby preventing concentration of current density.

2. Description of the Related Art

Generally, a nitride semiconductor refers to a III-V group semiconductor crystal, such as GaN, InN, AlN and the like, and is generally utilized for a light emitting device, which can emit light in a short wavelength range (from ultraviolet light to green light), especially blue light.

Since the nitride semiconductor light emitting diode is manufactured by use of an insulating substrate, such as a sapphire substrate, which satisfies lattice matching requirements for crystal growth, it has a horizontal structure in which two electrodes respectively connected to p-type and n-type nitride semiconductor layers are substantially aligned horizontal to an upper surface of the light emitting structure.

Due to the horizontal structure as described above, the nitride semiconductor light emitting diode has several disadvantages. First, a path for electric current is narrowly formed in the horizontal direction from an n-side electrode to a p-side electrode through an active layer. Due to such a narrow path of electric current, the nitride semiconductor light emitting diode having the horizontal structure exhibits increased forward voltage $V_f$, and thus is lowered in current efficiency.

Furthermore, since the nitride semiconductor light emitting diode of the horizontal structure is increased in heat generation amount caused by an increase in current density, and since low heat conductivity of a sapphire substrate thereof results in insufficient heat dissipation, thermal load is increased between the sapphire substrate and the nitride semiconductor light emitting structure, causing mechanical stress to be applied therebetween, so that the diode becomes unstable.

Furthermore, since areas of an active layer and a p-type nitride semiconductor layer removed for forming the n-side electrode must be larger than an area of the n-side electrode formed by a subsequent process, the nitride semiconductor light emitting diode of the horizontal structure has a reduced light emitting area, thereby reducing light emitting efficiency depending on brightness with respect to a size of the diode.

In order to enhance the disadvantages of the nitride semiconductor light emitting diode having the horizontal structure, a vertical type nitride semiconductor light emitting diode from which the sapphire substrate is removed by a laser lift-off process has been actively developed.

FIGS. 1a and 1b are a side view and a top view illustrating a conventional vertical type nitride semiconductor light emitting diode. Referring to FIGS. 1a and 1b, when manufacturing the conventional nitride semiconductor light emitting diode, an n-type nitride layer 11, an active layer 12, and a p-type nitride layer 13 are sequentially formed on a sapphire substrate, and then the sapphire substrate is removed by the laser lift-off process. In this construction, the n-type nitride layer 11 becomes the uppermost layer, and an upper surface thereof is used as a light emitting surface. Accordingly, the conventional nitride semiconductor light emitting diode comprises the n-type nitride layer 11, the active layer 12, the p-type nitride layer 13, a conductive bonding layer 14, and a conductive supporting substrate 15 sequentially formed in this order from the top of the nitride semiconductor light emitting diode. The nitride semiconductor light emitting diode 13 further comprises an n-side electrode 16 formed on an upper surface of the n-type nitride semiconductor layer 13, such that a wire bonding portion is provided to the n-side electrode 16 for supplying electric current.

As shown in FIGS. 1a and 1b, the conventional vertical type nitride semiconductor light emitting diode has the n-side electrode 16 formed at the center of the upper surface of the n-type nitride semiconductor layer 11 which is the light emitting surface. When the n-side electrode 16 is formed at the center of the upper surface of the n-type nitride semiconductor layer 11, there occurs a problem in that a wire W connected to the n-side electrode 16 by wire bonding shields light emitted from the upper surface of the n-type nitride semiconductor layer.

Meanwhile, when the n-side electrode 16 is formed near an edge of the n-type nitride semiconductor layer 11, current density is concentrated on the bottom of the n-side electrode 16 due to excellent conductivity of the n-type nitride semiconductor layer 11, thereby reducing an effective area for emitting the light.

Accordingly, in order to solve the problem of shielding light by the wire bonding portion, there is a need to provide a nitride semiconductor light emitting diode with a vertical structure, which has a new electrode structure, designed to have the n-side electrode formed adjacent to an edge of the n-type nitride semiconductor layer while ensuring effective distribution of current density.

SUMMARY OF THE INVENTION

The present invention has been made in view of the above problems, and it is an object of the present invention to provide a flip-chip nitride semiconductor light emitting diode, which has a new electrode structure, designed to have an n-side electrode formed adjacent to an edge of an n-type nitride semiconductor layer while ensuring effective distribution of current density, thereby enhancing light emitting efficiency.

In accordance with one aspect of the present invention, the above and other objects can be accomplished by the provision of a vertical type nitride semiconductor light emitting diode, comprising: an n-type nitride semiconductor layer; an active layer formed under the n-type nitride semiconductor layer; a p-type nitride semiconductor layer formed under the active layer; and an n-side electrode comprising a bonding pad formed adjacent to an edge of an upper surface of the n-type nitride semiconductor layer and at least one extended electrode formed in a band from the bonding pad.

The nitride semiconductor light emitting diode may further comprise a buffer layer formed between the n-type nitride semiconductor layer and the n-side electrode. The nitride semiconductor light emitting diode may further comprise a transparent electrode layer formed between the n-type nitride semiconductor layer and the n-side electrode. The transparent electrode layer may be composed of a material allowing effective current spreading while allowing light to be easily transmitted. For this purpose, the transparent electrode layer may comprise at least one layer composed of an oxide selected from the group consisting of indium tin-based oxide (ITO), indium oxide (IO), tin based oxide ($SnO_2$), zinc-based oxide (ZnO), and indium zinc-based oxide (IZO).

The nitride semiconductor light emitting diode may further comprise a conductive supporting substrate formed under the p-type nitride semiconductor layer. At this time, the nitride semiconductor light emitting diode may further comprise a conductive bonding layer between the conductive supporting substrate and the p-type nitride semiconductor layer.

The nitride semiconductor light emitting diode may further comprise a highly reflective ohmic contact layer formed under the p-type nitride semiconductor layer. The highly reflective ohmic contact layer may be composed of a material for reflecting light generated from the active layer towards the n-type nitride semiconductor layer used as a light emitting surface in order to enhance brightness while providing an ohmic contact with the p-type nitride semiconductor layer. The material may consist of Ag, Ni, Al, Rh, Pd, Ir, Ru, Mg, Zn, Pt, Au and combinations thereof.

Generally, the nitride semiconductor light emitting diode has a rectangular cross section. That is, since the uppermost layer of the nitride semiconductor light emitting diode is an upper surface of the n-type nitride semiconductor layer, the upper surface of the n-type nitride semiconductor layer has a rectangular shape. The present invention provides the vertical type nitride semiconductor light emitting diode in which the n-side electrode formed on the upper surface of the n-type nitride semiconductor layer having the rectangular shape may have different constructions.

As one example of the n-side electrode, the n-side electrode may comprise a bonding pad formed adjacent to one corner of the upper surface of the n-type nitride semiconductor layer, and a first extended electrode formed from the bonding pad along four sides of the upper surface of the n-type nitride semiconductor layer. In this case, the n-side electrode may further comprise a plurality of second extended electrodes formed from a portion of the first extended electrode formed along one side of the upper surface of the n-type nitride semiconductor layer to another portion of the first extended electrode formed along another side of the upper surface opposite to the one side of the upper surface of the n-type nitride semiconductor layer.

As another example of the n-side electrode, the n-side electrode may comprise a bonding pad formed adjacent to one corner of the upper surface of the n-type nitride semiconductor layer, first and second extended electrodes formed from the bonding pad along both sides of the upper surface of the n-type nitride semiconductor layer constituting the corner where the bonding pad is formed, and a third extended electrode diagonally formed from the bonding pad of the corner.

As still another example of the n-side electrode, the n-side electrode may comprise a bonding pad formed adjacent to one corner of the upper surface of the n-type nitride semiconductor layer, a first extended electrode formed from the bonding pad to a position adjacent to another corner opposite to the corner where the bonding pad is formed, and second and third extended electrodes formed from the first extended electrode along both sides of the upper surface of the n-type nitride semiconductor layer constituting the other corner opposite to the corner where the bonding pad is formed.

As still another example of the n-side electrode, the n-side electrode may comprise a bonding pad formed adjacent to the central region of one side of the upper surface of the n-type nitride semiconductor layer, and an extended electrode formed from the bonding pad along four sides of the upper surface of the n-type nitride semiconductor layer.

As still another example of the n-side electrode, the n-side electrode may comprise a bonding pad formed adjacent to the central region of one side of the upper surface of the n-type nitride semiconductor layer, first and second extended electrodes formed from the bonding pad along the one side of the upper surface of the n-type nitride semiconductor layer where the bonding pad is adjacently formed, a third extended electrode formed from the bonding pad to a position adjacent to another side opposite to the one side of the upper surface of the n-type nitride semiconductor layer where the bonding pad is adjacently formed, and a fourth extended electrode formed from the third extended electrode along the other side opposite to the one side of the upper surface of the n-type nitride semiconductor layer where the bonding pad is adjacently formed.

As yet another example of the n-side electrode, the n-side electrode may comprise a bonding pad formed adjacent to the central region of one side of the upper surface of the n-type nitride semiconductor layer, a first extended electrode formed from the bonding pad to a position adjacent to another side opposite to the one side of the upper surface of the n-type nitride semiconductor layer where the bonding pad is adjacently formed, and a second extended electrode formed from the first extended electrode along three sides except for the one side of the upper surface of the n-type nitride semiconductor layer where the bonding pad is adjacently formed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
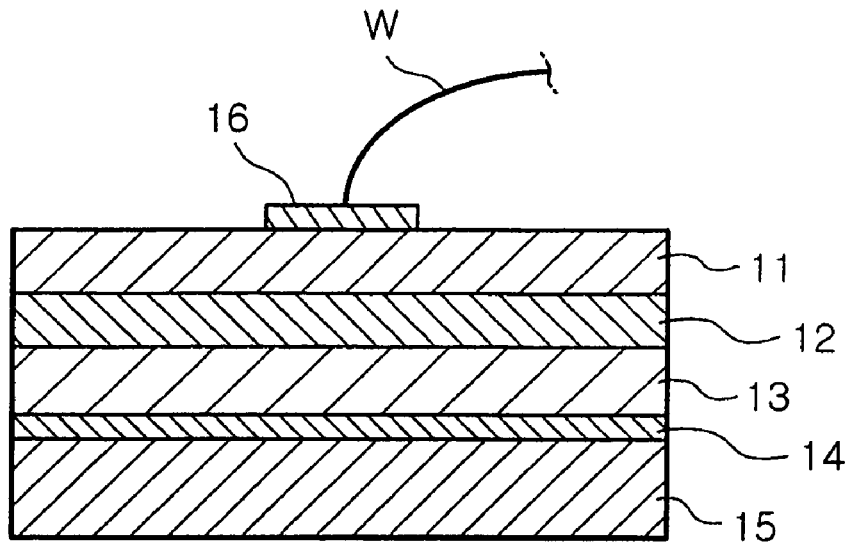
FIGS. 1a and 1b are a cross-sectional view and a top view illustrating a conventional vertical type nitride semiconductor light emitting diode.
Figure 1:
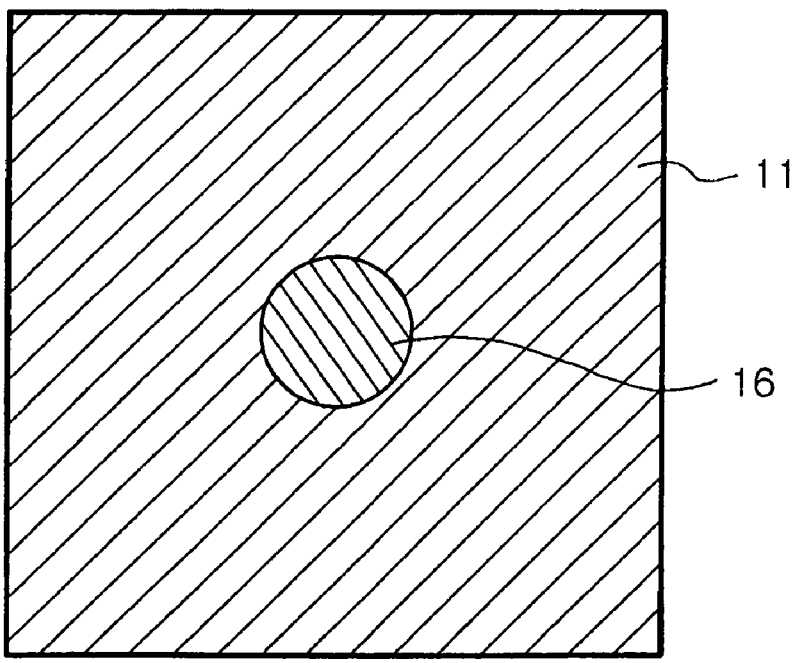

Preferred embodiments of the present invention will now be described in detail with reference to the accompanying drawings, in which like reference numerals refer to like elements having similar functions and constructions.

Figure 2:
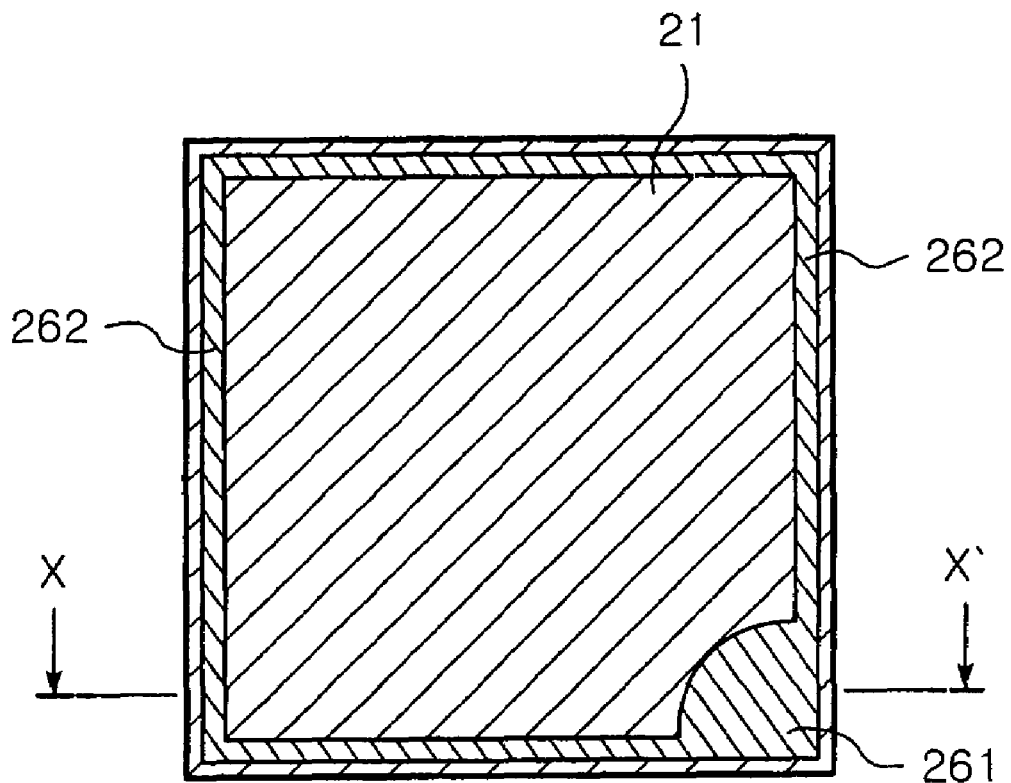
FIGS. 2a and 2b are a top view and a cross-sectional view illustrating a vertical type nitride semiconductor light emitting diode according to one embodiment of the present invention.
Figure 2:
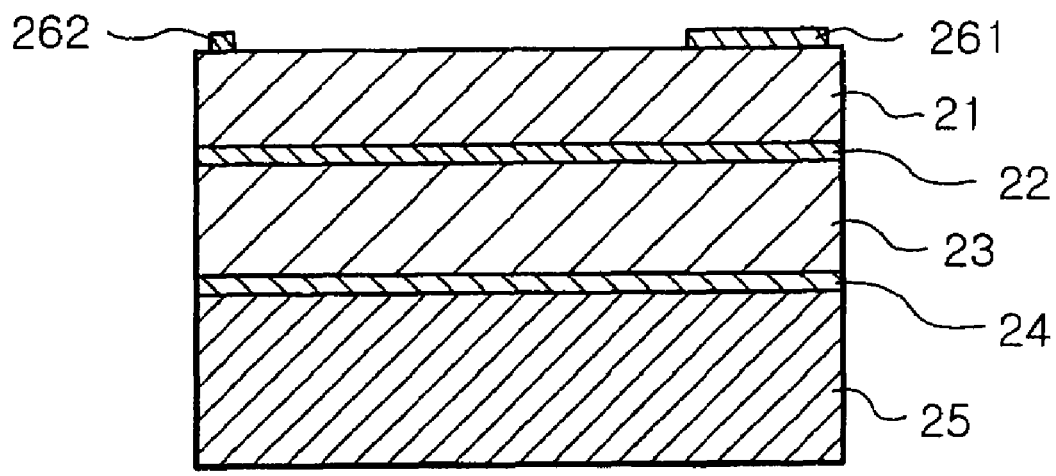

FIGS. 2a and 2b are a top view and a cross-sectional view illustrating a vertical type nitride semiconductor light emitting diode according to one embodiment of the invention. Referring to FIGS. 2a and 2b, the vertical type nitride semiconductor light emitting diode according to the embodiment of the invention comprises: an n-type nitride semiconductor layer 21; an active layer 22 formed under the n-type nitride semiconductor layer 21; a p-type nitride semiconductor layer 23 formed under the active layer 22; and an n-side electrode comprising a bonding pad 261 formed adjacent to an edge of an upper surface of the n-type nitride semiconductor layer 21 and an extended electrode 262 formed in a band from the bonding pad 261.

Additionally, the vertical type nitride semiconductor light emitting diode according to the embodiment comprises a conductive bonding layer 24, and a conductive supporting substrate 25 sequentially formed under the p-type nitride semiconductor layer 23.

As with the conventional nitride semiconductor light emitting diode, when manufacturing the vertical type nitride semiconductor light emitting diode, the n-type nitride layer 21, the active layer 22, and the p-type nitride layer 23 are sequentially formed on a sapphire substrate, and then the sapphire substrate is removed by a laser lift-off process. Then, the n-type nitride layer 21 becomes the uppermost layer of the nitride semiconductor light emitting diode, and an upper surface of the n-type nitride layer 11 is used as a light emitting surface. Thus, herein, the n-type nitride semiconductor layer 21 will be described as the uppermost layer of the vertical type nitride semiconductor light emitting diode.

The n-type nitride semiconductor layer 21 may be composed of an n-doped semiconductor material having the formula $Al_xIn_yGa_{(1-x-y)}N$ ($0 \leq x \leq 1$, $0 \leq y \leq 1$, $0 \leq x+y \leq 1$), such as GaN, AlGaN, and GaInN. An impurity doped to the n-type nitride semiconductor layer 21 includes Si, Ge, Se, Te, C or the like. The n-type nitride semiconductor layer 21 is formed by growing the semiconductor material on the sapphire substrate by use of well-known deposition processes, such as Metal Organic Chemical Vapor Deposition (MOCVD), Molecular Beam Epitaxy (MBE), or Hybrid Vapor Phase Epitaxy (HVPE).

Generally, a buffer layer may be formed between the sapphire substrate and the n-type nitride semiconductor layer 21 in order to relive lattice mismatching. As for the buffer layer, a layer for low temperature nuclei growth and/or an undoped nitride layer, such as GaN or AlN, typically having a thickness of several dozen nm can be used.

The active layer 22 is a layer for emitting light, and comprises a nitride semiconductor layer, such as GaN or InGaN, having a single or multi-quantum well structure. As with the n-type nitride semiconductor layer 21, the active layer 22 is formed by use of well-known deposition processes, such as MOCVD, MBE, or HVPE.

As with the n-type nitride semiconductor layer 21, the p-type nitride semiconductor layer 23 is composed of a p-doped semiconductor material having the formula $Al_xIn_yGa_{(1-x-y)}N$ (where $0 \leq x \leq 1$, $0 \leq y \leq 1$, $0 \leq x+y \leq 1$), such as GaN, AlGaN, and GaInN. An impurity doped on the p-type nitride semiconductor layer 23 includes Mg, Zn, Be or the like. The p-type nitride semiconductor layer 23 is formed by growing the semiconductor material on the active layer 22 by well-known deposition processes, such as MOCVD, MBE, or HVPE.

The n-side electrode for supplying electric current is formed on the upper surface of the n-type nitride semiconductor layer 21. The n-side electrode may comprise a single layer or a plurality of layers composed of a material selected from the group consisting of Ti, Cr, Al, Cu and Au. The n-side electrode may be formed by a deposition process or a sputtering process, which is a typical process for growing a metal layer.

In view of construction of the n-side electrode, the n-side electrode is characterized in that it comprises the bonding pad 261 for wire bonding formed adjacent to the edge of the upper surface of the n-type nitride semiconductor layer 21 and the at least one extended electrode 262 formed in a band from the bonding pad 261. Referring to FIG. 2a, as one example of the n-side electrode, the bonding pad 261 is formed adjacent to one corner of the upper surface of the n-type nitride semiconductor layer 21, and the extended electrode 262 is formed from the bonding pad 261 along four sides of the upper surface thereof.

As shown in FIG. 2a, according to the invention, the bonding pad 261 of the n-side electrode is formed adjacent to the corner of the upper surface of the n-type nitride semiconductor layer 21. As a result, the problem of shielding light emitted from the active layer by wire upon wire bonding can be solved. Additionally, the extended electrode 262 is extended from the bonding pad 261 along the four sides of the upper surface of the n-type nitride semiconductor layer, thereby preventing current density from being concentrated on the bottom of the bonding pad 261, and thus ensuring uniform distribution of the current density.

Although not shown in the drawings, as a modification of the embodiment, the n-side electrode further comprises a plurality of extended electrodes formed from a portion of the extended electrode 262 formed along one side of the upper surface of the n-type nitride semiconductor layer 21 to another portion of the extended electrode 262 formed along another side opposite to the one side of the upper surface of the n-type nitride semiconductor layer 21. If the extended electrode 262 formed from the bonding pad 261 along the four sides of the upper surface of the n-type nitride semiconductor layer 21 is defined as a first extended electrode, and the additional extended electrodes are defined as second electrodes, the first extended electrode forms a periphery of the upper surface of the n-type nitride semiconductor layer 21, and the second electrodes form a net-shaped extended electrodes connecting opposite portions of the first extended electrode.

Meanwhile, when the n-type nitride semiconductor layer 21 is grown on the sapphire substrate, the buffer layer is formed between the sapphire substrate and the n-type nitride semiconductor layer 21 in order to relieve differences between lattice parameters and between thermal expansion coefficients. In this case, during the process of manufacturing the vertical type nitride semiconductor light emitting diode, even after the sapphire substrate is removed by the laser lift-off process, the buffer layer may remain. Conventionally, when manufacturing the vertical type nitride semiconductor light emitting diode, the buffer layer is also removed by dry etching after removing the sapphire substrate. However, according to the invention, a process of removing the buffer layer may be omitted. In other words, according to the invention, the vertical type nitride semiconductor light emitting diode may comprise the buffer layer between the n-type nitride semiconductor layer 21 and the n-side electrode. Since the buffer layer comprises an undoped nitride layer, it can relieve a current crowding phenomenon wherein current density is concentrated on the bottom of the n-side electrode.

The conductive bonding layer 24 is selectively formed between the p-type nitride semiconductor layer 23 and the conductive supporting substrate 25. The conductive bonding layer 24 is formed in order to reinforce contact between the p-type nitride semiconductor layer 23 and the conductive supporting substrate 25, and is generally composed of a conductive material with bonding properties. Preferably, the material is a metallic bonding agent selected from the group consisting of Au—Sn, Sn, In, Au—Ag, and Pb—Sn.

The conductive supporting substrate 25 is composed of a conductive material, such as a silicon substrate or a metallic substrate. The light emitting diode comprising the n-type nitride semiconductor layer 21, the active layer 22 and the p-type semiconductor layer 23 has a very small size, and thus it can be difficult to apply the light emitting diode to real world applications. With regard to this, the conductive supporting substrate 25 serves to support the light emitting diode while serving as the p-side electrode in order to allow the n-type vertical type nitride semiconductor light emitting diode to have an appropriate size.

As another method for forming the conductive supporting substrate 25, the conductive supporting substrate 25 having a predetermined thickness may be directly formed under the p-side nitride semiconductor layer 23 without using the conductive bonding layer 24 by a general deposition process, a sputtering process or a coating process. In this case, the conductive bonding layer 24 is omitted, and the conductive supporting substrate 25 is directly formed under the p-side nitride semiconductor layer 23.

Figure 3:
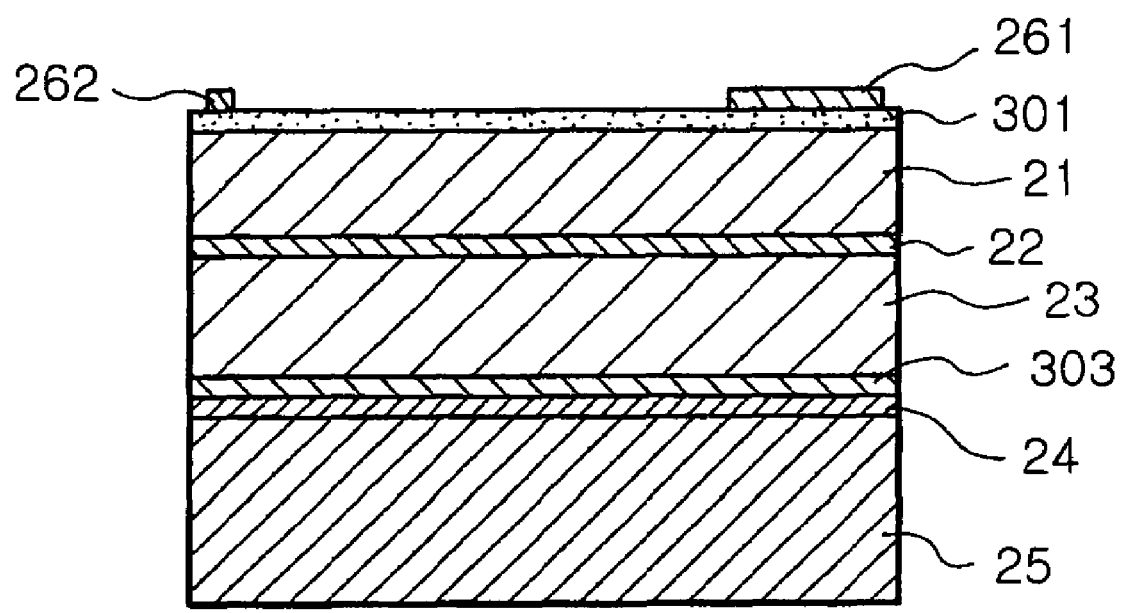
FIG. 3 is a cross-sectional view illustrating a vertical type nitride semiconductor light emitting diode according to another embodiment of the present invention.

FIG. 3 is a cross-sectional view illustrating a vertical type nitride semiconductor light emitting diode according to another embodiment of the invention. In addition to the components of the nitride semiconductor light emitting diode shown in FIG. 2a, the vertical type nitride semiconductor light emitting diode shown in FIG. 3 further comprises a transparent electrode layer 301 formed between the n-type nitride semiconductor layer 21 and the components 261 and 262 of the n-side electrode, and a highly reflective ohmic contact layer 303 formed between the conductive bonding layer 24 and the p-type nitride semiconductor layer 23.

The transparent electrode layer 301 prevents current density from being concentrated on the bottom of the n-side electrodes 261 and 262 by uniformly spreading electric current injected from the n-side electrodes 261 and 262. In this embodiment, the nitride semiconductor light emitting diode further comprises the transparent electrode layer 301 in addition to the n-side electrodes 261 and 262, which can prevent the current density from being concentrated on the bottom thereof, thereby more effectively distributing the current density compared with the nitride semiconductor light emitting diode shown in FIG. 2a.

The transparent electrode layer 301 must be sufficiently conductive to ensure current spreading, and since it is formed on the upper surface of the n-type nitride semiconductor layer 21, it must have good translucency for allowing light to be easily transmitted therethrough. For this purpose, the transparent electrode layer 301 may comprise at least one layer composed of an oxide selected from the group consisting of indium tin-based oxide (ITO), indium oxide (IO), tin based oxide (SnO$_2$), zinc-based oxide (ZnO), and indium zinc-based oxide (IZO).

The highly reflective ohmic contact layer 303 is a layer for enhancing effective brightness towards the upper surface of the n-type nitride semiconductor layer 21 serving as the light emitting surface, and is formed of a metallic material appropriate to provide high reflectivity while lowering contact resistance with the p-type nitride semiconductor layer 23 having relatively high band gap energy. The highly reflective ohmic contact layer 303 may comprise at least one layer composed of a material selected from the group consisting of Ag, Ni, Al, Rh, Pd, Ir, Ru, Mg, Zn, Pt, Au and combinations thereof.

Figure 4:
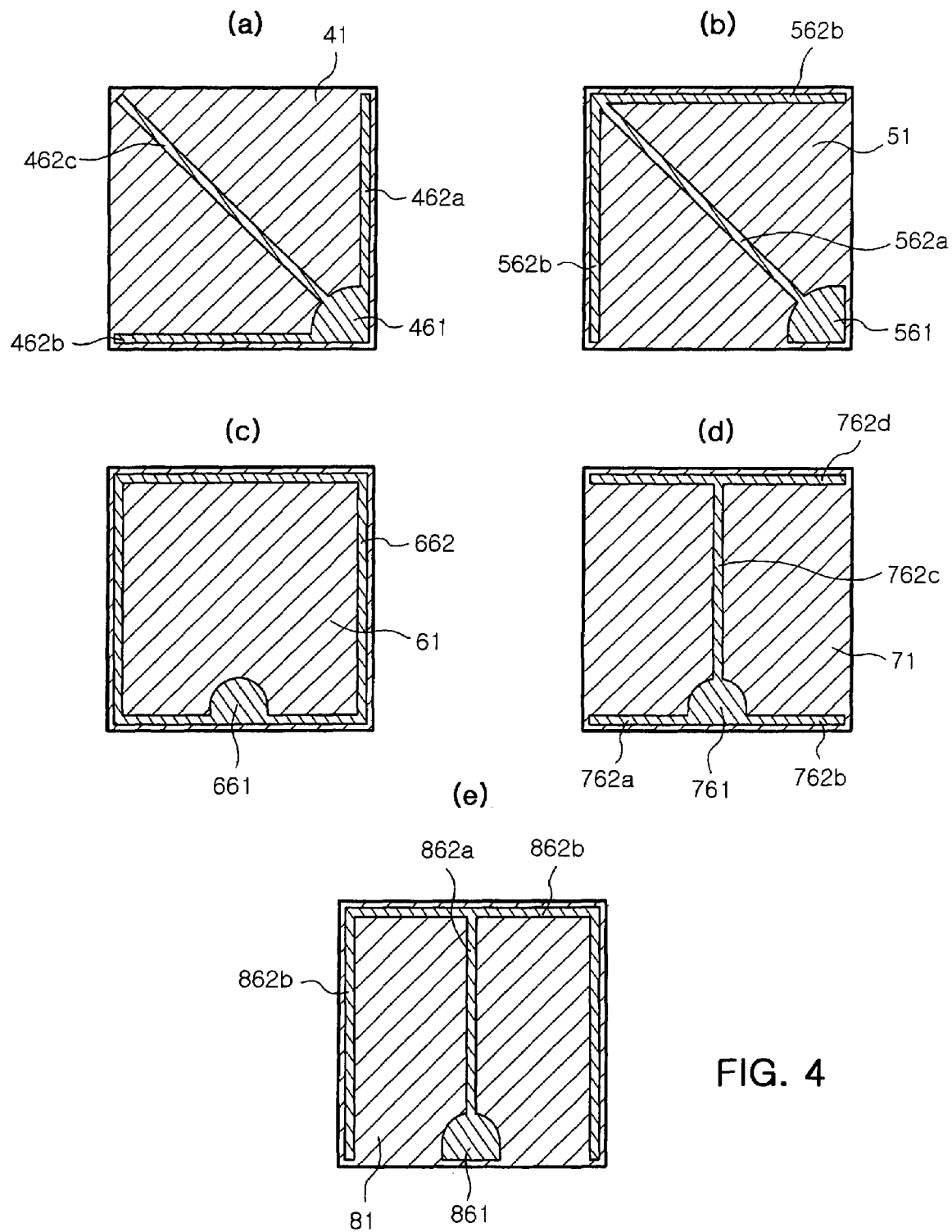
FIGS. 4a to 4e are top views illustrating modifications of an n-side electrode of the present invention.

As described above, the present invention is characterized in that the nitride light emitting diode of the vertical structure has the n-side electrode comprising the bonding pad formed adjacent to the edge of the upper surface of the n-type nitride semiconductor layer and the extended electrode formed from the bonding pad, thereby solving the problems of shielding the emitted light by the wire bonding portion and of current density concentration. Various modifications of the n-side electrode of the invention will be described with reference to FIG. 4.

Generally, the vertical type nitride semiconductor light emitting diode has a rectangular-shaped cross section. That is, the uppermost layer of the vertical type nitride semiconductor light emitting diode becomes the upper surface of the n-type nitride semiconductor layer, and thus the upper surface of the n-type nitride semiconductor layer has the rectangular shape. Hereinafter, n-side electrodes having different constructions formed on the rectangular upper surface of the n-type nitride semiconductor layer will be described.

FIG. 4a is a top view illustrating one modification of the n-side electrode. Referring to FIG. 4a, the n-side electrode comprises a bonding pad 461 formed adjacent to one corner of an upper surface of an n-type nitride semiconductor layer 41, and first and second extended electrodes 462a and 462b formed from the bonding pad 461 along both sides of the upper surface of the n-type nitride semiconductor layer constituting the corner where the bonding pad 461 is formed, and a third extended electrode 462c diagonally formed from the bonding pad 461 of the corner.

FIG. 4b is a top view illustrating another modification of the n-side electrode. Referring to FIG. 4b, the n-side electrode comprises a bonding pad 561 formed adjacent to one corner of an upper surface of an n-type nitride semiconductor layer 51, a first extended electrode 562a formed from the bonding pad 561 to a position adjacent to another corner opposite to the corner where the bonding pad 561 is formed, and second and third extended electrodes 562b and 562c formed from the first extended electrode 562a along both sides of the upper surface of the n-type nitride semiconductor layer 51 constituting the other corner opposite to the corner where the bonding pad 561 is formed.

FIG. 4c is a top view illustrating still another modification of the n-side electrode. Referring to FIG. 4c, the n-side electrode comprises a bonding pad 661 formed adjacent to the central region of one side of an upper surface of an n-type nitride semiconductor layer 61, and an extended electrode 662 formed from the bonding pad 661 along four sides of the upper surface of the n-type nitride semiconductor layer 61.

FIG. 4d is a top view illustrating still another modification of the n-side electrode. Referring to FIG. 4d, the n-side electrode may comprise a bonding pad 761 formed adjacent to the central region of one side of an upper surface of an n-type nitride semiconductor layer 71, first and second extended electrodes 762a and 762b formed from the bonding pad 761 along the one side of the upper surface of the n-type nitride semiconductor layer 71 where the bonding pad is adjacently formed, a third extended electrode 762c formed from the bonding pad 761 to a position adjacent to another side opposite to the one side of the upper surface of the n-type nitride semiconductor layer 71 where the bonding pad 761 is adjacently formed, and a fourth extended electrode 762d formed from the third extended electrode 762c along the other side opposite to the one side of the upper surface of the n-type nitride semiconductor layer 71 where the bonding pad 761 is adjacently formed.

FIG. 4e is a top view illustrating yet another modification of the n-side electrode. Referring to FIG. 4e, the n-side electrode comprises a bonding pad 861 formed adjacent to the central region of one side of an upper surface of an n-type nitride semiconductor layer 81, a first extended electrode 862a formed from the bonding pad 861 to a position adjacent to another side opposite to the one side of the upper surface of the n-type nitride semiconductor layer 81 where the bonding pad 861 is adjacently formed, and a second extended electrode 862b formed from the first extended electrode 862a along three sides except for the one side of the upper surface of the n-type nitride semiconductor layer 81 where the bonding pad 861 is adjacently formed.

As apparent from the above description, according to the invention, the vertical type nitride semiconductor light emitting diode has the bonding pad formed adjacent to the edge of the upper surface of the n-type nitride semiconductor layer, thereby solving the problem of shielding the emitted light by the wire bonding portion.

Furthermore, the vertical type nitride semiconductor light emitting diode has the extended electrode formed in various shapes from the bonding pad, thereby alleviating the problem of current crowding occurring when the bonding pad is formed adjacent to the edge of the n-type nitride semiconductor layer, and ensures effective distribution of the current density, thereby enhancing the light emitting efficiency of the light emitting diode.

Although the preferred embodiments of the invention have been disclosed for illustrative purpose, those skilled in the art will appreciate that various modifications, additions and substitutions are possible without departing from the scope and spirit of the invention as disclosed in the accompanying claims.

What is claimed is:

1. A vertical type nitride semiconductor light emitting diode, comprising:
    an n-type nitride semiconductor layer having an upper surface and a lower surface located opposite the upper surface;
    an active layer formed on the lower surface of the n-type nitride semiconductor layer;
    a p-type nitride semiconductor layer formed under the active layer; and
    an n-side electrode formed on the upper surface of the n-type nitride semiconductor layer,
    wherein the n-side electrode has a bonding pad formed adjacent to an edge of the upper surface of the n-type nitride semiconductor layer and at least one extended electrode formed in a band from the bonding pad.

2. The light emitting diode as set forth in claim 1, further comprising:
    a buffer layer formed between the n-type nitride semiconductor layer and the n-side electrode.

3. The light emitting diode as set forth in claim 1, further comprising:
    a transparent electrode layer formed between the n-type nitride semiconductor layer and the n-side electrode.

4. The light emitting diode as set forth in claim 3, wherein the transparent electrode layer has at least one layer composed of an oxide selected from the group consisting of indium tin-based oxide (ITO), indium oxide (IO), tin based oxide ($SnO_2$), zinc-based oxide (ZnO), and indium zinc-based oxide (IZO).

5. The light emitting diode as set forth in claim 1, further comprising:
    a conductive supporting substrate formed under the p-type nitride semiconductor layer.

6. The light emitting diode as set forth in claim 5, further comprising:
    a conductive bonding layer between the conductive supporting substrate and the p-type nitride semiconductor layer.

7. The light emitting diode as set forth in claim 1, further comprising:
    a highly reflective ohmic contact layer formed under the p-type nitride semiconductor layer.

8. The light emitting diode as set forth in claim 7, wherein the highly reflective ohmic contact layer has at least one layer composed of a material selected from the group consisting of Ag, Ni, Al, Rh, Pd, Ir, Ru, Mg, Zn, Pt, Au and combinations thereof.

9. The light emitting diode as set forth in claim 1, wherein the n-type nitride semiconductor layer has a substantially rectangular-shaped upper surface,
    wherein the bonding pad of the n-side electrode has a bonding pad formed adjacent to one corner of the upper surface of the n-type nitride semiconductor layer, and
    wherein the at least one extended electrode has a first extended electrode formed from the bonding pad adjacent to the corner along four sides of the upper surface of the n-type nitride semiconductor layer.

10. The light emitting diode as set forth in claim 9, wherein the n-side electrode further comprises;
    a plurality of second extended electrodes formed from a portion of the first extended electrode formed along one side of the upper surface of the n-type nitride semiconductor layer to another portion of the first extended electrode formed along another side of the upper surface opposite to the one side of the upper surface of the n-type nitride semiconductor layer.

11. The light emitting diode as set forth in claim 1, wherein the n-type nitride semiconductor layer has a substantially rectangular-shaped upper surface,
    wherein the bonding pad of the n-side electrode has a bonding pad formed adjacent to one corner of the upper surface of the n-type nitride semiconductor layer, and
    wherein the at least one extended electrode of the n-side electrode comprises first and second extended electrodes formed from the bonding pad adjacent to the corner along both sides of the upper surface of the n-type nitride semiconductor layer constituting the corner where the bonding pad is formed, and a third extended electrode diagonally formed from the bonding pad of the corner.

12. The light emitting diode as set forth in claim 1, wherein the n-type nitride semiconductor layer has a substantially rectangular-shaped upper surface,
    wherein the bonding pad of the n-side electrode has a bonding pad formed adjacent to one corner of the upper surface of the n-type nitride semiconductor layer, and
    wherein the at least one extended electrode of the n-side electrode has a first extended electrode formed from the bonding pad of the corner to a position adjacent to another corner opposite to the corner where the bonding pad is formed, and second and third extended electrodes formed from the first extended electrode along both sides of the upper surface of the n-type nitride semiconductor layer constituting the other corner opposite to the corner where the bonding pad is formed.

13. The light emitting diode as set forth in claim 1, wherein the n-type nitride semiconductor layer has a substantially rectangular-shaped upper surface,
   wherein the bonding pad of the n-side electrode has a bonding pad formed adjacent to the central region of one side of the upper surface of the n-type nitride semiconductor layer, and
   wherein the at least one extended electrode of the n-side electrode has an extended electrode formed from the bonding pad adjacent to the substantially center of one side along four sides of the upper surface of the n-type nitride semiconductor layer.

14. The light emitting diode as set forth in claim 1, wherein the n-type nitride semiconductor layer has a substantially rectangular-shaped upper surface,
   wherein the bonding pad of the n-side electrode has a bonding pad formed adjacent to the central region of one side of the upper surface of the n-type nitride semiconductor layer, and
   wherein the at least one extended electrode of the n-side electrode comprises first and second extended electrodes formed from the bonding pad along the one side of the upper surface of the n-type nitride semiconductor layer where the bonding pad is adjacently formed, a third extended electrode formed from the bonding pad to a position adjacent to another side opposite to the one side of the upper surface of the n-type nitride semiconductor layer where the bonding pad is adjacently formed, and a fourth extended electrode formed from the third extended electrode along the other side opposite to the one side of the upper surface of the n-type nitride semiconductor layer where the bonding pad is adjacently formed.

15. The light emitting diode as set forth in claim 1, wherein the n-type nitride semiconductor layer has a substantially rectangular-shaped upper surface,
   wherein the bonding pad of the n-side electrode of the n-side electrode has a bonding pad formed adjacent to the central region of one side of the upper surface of the n-type nitride semiconductor layer, and
   wherein the at least one extended electrode has a first extended electrode formed from the bonding pad to a position adjacent to another side opposite to the one side of the upper surface of the n-type nitride semiconductor layer where the bonding pad is adjacently formed, and a second extended electrode formed from the first extended electrode along three sides except for the one side of the upper surface of the n-type nitride semiconductor layer where the bonding pad is adjacently formed.

* * * * *